(12) United States Patent
Lee

(10) Patent No.: US 6,746,954 B2
(45) Date of Patent: Jun. 8, 2004

(54) METHOD OF REWORKING TUNGSTEN PARTICLE CONTAMINATED SEMICONDUCTOR WAFERS

(75) Inventor: Chou-Feng Lee, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/188,750

(22) Filed: Jul. 2, 2002

(65) Prior Publication Data

US 2004/0005783 A1 Jan. 8, 2004

(51) Int. Cl.⁷ .......................................... H01L 21/4763
(52) U.S. Cl. ........................ 438/637; 438/638; 438/639
(58) Field of Search ................................ 438/5–13, 16, 438/638, 689, 705, 690, 691, 692

(56) References Cited

U.S. PATENT DOCUMENTS 5,637,185 A * 6/1997 Murarka et al. ....... 156/345.13
6,258,231 B1 * 7/2001 Easter et al. ................. 204/421
6,372,524 B1 * 4/2002 Xie et al. ......................... 438/8
6,417,098 B1 * 7/2002 Wong et al. ................. 438/638

\* cited by examiner

*Primary Examiner*—Dung A. Le
(74) *Attorney, Agent, or Firm*—Tung & Associates

(57) ABSTRACT

A method for reworking a metal particulate contaminated semiconductor wafer process surface following a metal dry etchback process including providing a semiconductor wafer including a dielectric insulating layer having anisotropically etched openings lined with a first barrier/adhesion layer formed according to a blanket deposition process and an overlying metal layer formed according to a blanket deposition process filling the anisotropically etched openings; dry etching in an etchback process to remove the metal layer to form a process surface revealing at least a portion of the first barrier/adhesion layer; performing a chemical mechanical polishing (CMP) process to rework the process surface to remove a remaining portion of the metal layer including the first barrier/adhesion layer to endpoint detection of the dielectric insulating layer; and, blanket depositing a second barrier/adhesion layer over the dielectric insulating layer.

20 Claims, 2 Drawing Sheets

METHOD OF REWORKING TUNGSTEN PARTICLE CONTAMINATED SEMICONDUCTOR WAFERS

FIELD OF THE INVENTION

This invention generally relates to semiconductor processing methods including formation of tungsten metallization plugs and a method to salvage the process wafer by reworking tungsten particle contaminated process wafers.

BACKGROUND OF THE INVENTION

Metallization interconnects are critical to the proper electronic function of semiconductor devices. Several advances in semiconductor processing have been aimed at improving signal transport speed by reducing metal interconnect resistivities and improving resistance to electromigration effects. Copper has increasingly become a metal of choice in, for example, upper levels of metallization in a multi-level semiconductor device due to its low resistivity and higher resistance to electromigration. Tungsten is still preferred for use in the lower metallization layers adjacent to the silicon substrate since it provides an effective diffusion barrier to metal diffusion from overlying metallization layers to react with the silicon substrate. Tungsten further has high resistance to electromigration and can effectively be used to fill high aspect ratio vias by chemical vapor deposition (CVD) processes.

For example, referring to FIG. 1A, a cross sectional side view of a portion of a semiconductor wafer is shown having a first metal layer 12, formed of, for example, an aluminum:copper alloy. A barrier/adhesion layer 14, for example titanium nitride, is provided over the metal layer 12. Overlying the barrier/adhesion layer 14 is formed an electrically insulating interlayer dielectric (ILD) layer 16, also referred to an intermetal dielectric (IMD). The IMD layer 16 is formed from silicon dioxide which is frequently doped with fluorine or carbon to lower the dielectric constant thereby decreasing signal slowing parasitic capacitances. Another barrier/adhesion layer (not shown), also functioning as an anti-reflective coating (ARC) to reduce undesired light reflections, for example titanium nitride, is optionally deposited over the IMD layer 16 prior to a photolithographic patterning process to form a via etching pattern.

Still Referring to FIG. 1A, a via opening 20 is anisotropically etched through the IMD layer according to a reaction ion etching (RIE) process to form closed communication with the underlying metal layer 12. A barrier/adhesion layer 18, for example, titanium nitride is then blanket deposited over the via opening to form a barrier/adhesion layer lining the via opening 20.

Referring to FIG. 1B, tungsten is blanket deposited by a CVD process to fill the via opening 20 and form an overlying tungsten layer 22 over the barrier diffusion layer 18. Referring to FIG. 1C, the excess tungsten metal overlying the barrier diffusion layer 18 above the via level is then removed according to a tungsten metal dry etching (plasma etching) etchback process.

A serious problem with the prior art method of using a dry etchback process to remove the tungsten metal above the via level is that during the dry etchback process unetched residual tungsten particles or areas e.g., 22A, 22B ranging in size from about 0.5 microns to about 40 microns of particles frequently remain on the wafer process surface. It is believed that the unetched tungsten areas are caused by tungsten particles forming on the surface thereby acting as etching masks, preventing the etching of underlying tungsten. Tungsten particle formation is a serious problem in both CVD and etching. The tungsten metal does not adhere well to most surfaces including heated surfaces. In addition, stresses build up quickly in deposited tungsten, for example on the wafer backside or chamber walls ultimately causing flaking off of tungsten particles. The problem is exacerbated in a subsequent dry etching process making it necessary to clean the wafer edged and backside portions of tungsten including time-intensive and frequent cleaning of the etching and deposition chambers.

The unetched tungsten areas resulting from tungsten particle contamination on the wafer process surface make further dry etching impractical as the underlying barrier/adhesion layer and the IMD layer will be partially etched away in the process affecting wafer surface planarity and wafer design constraints. Wet etching or cleaning processes are also costly and impractical for removing the tungsten residue. According to prior art practices, the tungsten residue on the process wafer surface frequently makes scrapping (disposing of) the process wafer the only viable economic alternative.

Therefore, there is a need in the semiconductor processing art to develop a method for reworking a semiconductor process wafer following tungsten etchback to remove overlying residual unetched tungsten areas or particles while minimizing process steps and preserving the underlying material process layers.

It is therefore an object of the invention to provide a method for reworking a semiconductor process wafer following tungsten etchback to remove overlying residual unetched tungsten areas or particles while minimizing process steps and preserving the underlying material process layers while overcoming other shortcomings of the prior art.

SUMMARY OF THE INVENTION

To achieve the foregoing and other objects, and in accordance with the purposes of the present invention, as embodied and broadly described herein, the present invention provides a method for reworking a metal particulate contaminated semiconductor wafer process surface following a metal dry etchback process.

In a first embodiment, the method includes providing a semiconductor wafer including a dielectric insulating layer having anisotropically etched openings lined with a first barrier/adhesion layer formed according to a blanket deposition process and an overlying metal layer formed according to a blanket deposition process filling the anisotropically etched openings; dry etching in an etchback process to remove the metal layer to form a process surface revealing at least a portion of the first barrier/adhesion layer; performing a chemical mechanical polishing (CMP) process to rework the process surface to remove a remaining portion of the metal layer including the first barrier/adhesion layer to endpoint detection of the dielectric insulating layer; and, blanket depositing a second barrier/adhesion layer over the dielectric insulating layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained by reference to formation of a tungsten plug, it will be appreciated that the method of the present invention may be adapted to the reworking of any semiconductor process surface where residual unetched metal residue contaminates a process surface.

In one embodiment of the present invention, a semiconductor wafer having a process surface is provided with an overlying layer of metal. A metal dry etching process is then carried out to etch back the overlying metal layer to at least partially reveal an underlying barrier/adhesion layer. A chemical mechanical polishing (CMP) process is then carried out to remove residual metal remaining on the process surface and remove the underlying barrier/adhesion layer to endpoint detection of an underlying dielectric insulating layer. The barrier/adhesion layer is then re-deposited. Further processing steps, for example, including deposition of a second metal layer or dielectric insulating layer is then carried out followed by a photolithographic patterning and reactive ion etching (RIE) step to replicate alignment mark areas on the process wafer surface.

Figure 1A:
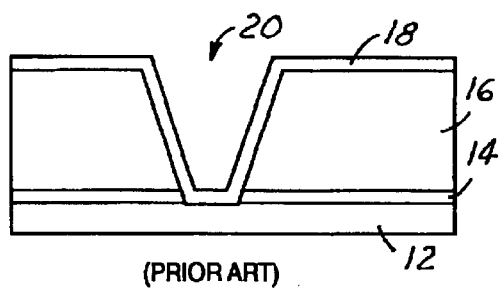
FIGS. 1A–1C are cross sectional side view representations of a portion of a semiconductor wafer at stages in manufacture according to the prior art.
Figure 1B:
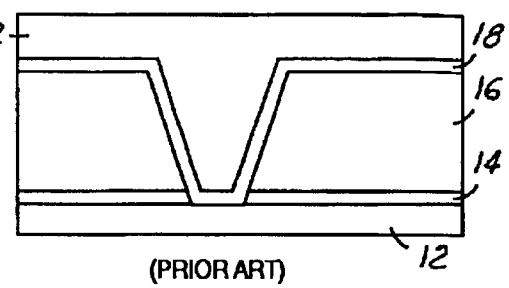
Figure 1C:
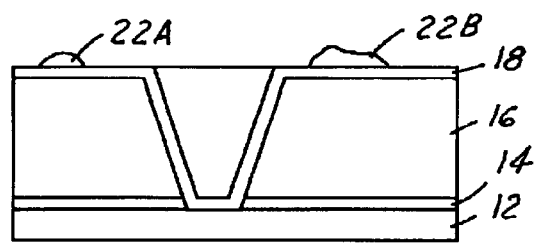
Figure 2A:
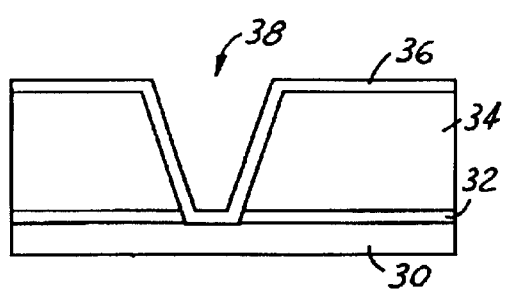
FIGS. 2A–2E are cross sectional side view representations of a portion of a semiconductor wafer at stages in manufacture according to the method of the present invention.

Referring to FIGS. 2A–2E, in an exemplary embodiment of the method of the present invention, side view portions of a semiconductor wafer are shown at stages in a manufacturing process. Referring to FIG. 2A, a first metal layer 30, for example a contact layer formed of an aluminum:copper alloy is deposited by conventional methods, for example, physical vapor deposition (PVD). A barrier/adhesion layer 32, for example titanium nitride or silicated titanium nitride, is provided over the metal layer 30. In one example, the titanium nitride layer is deposited by conventional CVD or PVD methods, for example, low pressure CVD (LPCVD), to a thickness of about 200 to about 800 Angstroms. A titanium layer may optionally be first deposited, for example, by conventional PVD methods. Overlying the adhesion/barrier layer 32 is formed an inter-metal dielectric (IMD) layer 34, formed of, for example a silicon dioxide, and optionally including a dopant such as fluorine or carbon to lower the dielectric constant. The IMD layer is typically formed by plasma enhanced CVD (e.g., PECVD or HDP-CVD) deposited to a thickness of about 3000 to about 10,000 Angstroms. Another barrier/adhesion layer (not shown), for example titanium nitride, also functioning as an anti-reflective coating (ARC) is preferably deposited over the IMD layer 34 to reduce light reflections in a subsequent photolithographic patterning process to form a via opening etching pattern.

Still referring to FIG. 2A, following a conventional photolithographic patterning and anisotropic etching process a via opening 38 is anisotropically etched by a conventional RIE process, for example including fluorocarbon and hydrofluorocarbon etching chemistries in a multi-step process, including etching through the IMD layer, and barrier/adhesion layer 32 to form closed communication with the underlying metal layer 30. Another barrier/adhesion layer 36, for example, titanium nitride, is blanket deposited over the via opening to line the via opening 38.

Figure 2B:
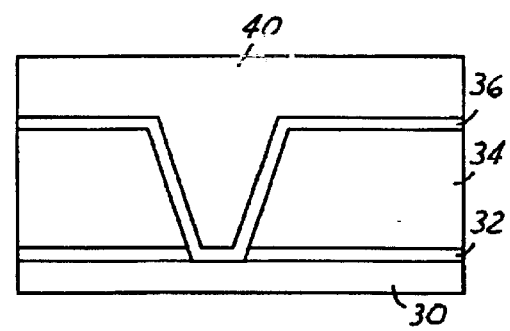
Figure 2C:
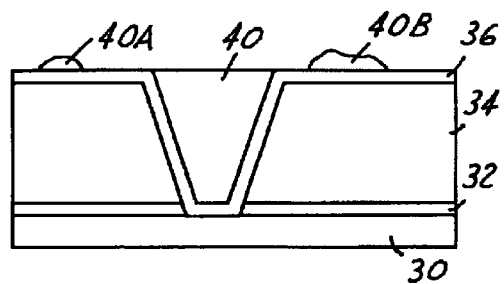

Referring to FIG. 2B, tungsten is deposited by a conventional CVD process, for example by using hydrogen and/or silane reduction of $WF_6$ by a low pressure CVD (LPCVD) process carried out at about 350° C. to 450° C., to fill the via and form an overlying tungsten layer 40 over the barrier/adhesion layer 36. Referring to FIG. 2C, the tungsten metal overlying the barrier/diffusion layer 36 above the via level is then removed to at least partially reveal the underlying barrier/adhesion layer 36 according to a conventional tungsten metal dry etch back process, for example, using a chlorine or bromine based etching chemistry.

Following the tungsten etchback process, it has been found that unetched tungsten areas or particles, e.g., 40A, 40B, remain on about 40 percent of the die areas on the wafer, believed to be due to tungsten particle formation on the wafer process surface acting as an etching mask to underlying tungsten. For example, according to conventional optical scanning techniques about 300 to about 800 tungsten particles (unetched areas) per die area having a spherical shape typically remain on the wafer process surface following a typical tungsten etchback process. The sizes of the tungsten particles range from about 0.5 microns to about 40 microns.

Figure 2D:
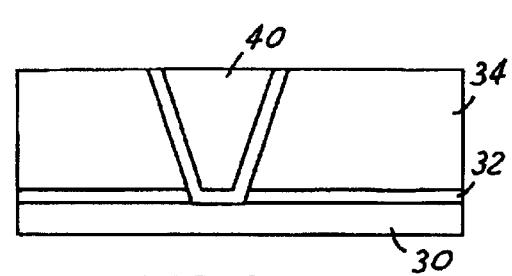

Referring to FIG. 2D, according to the present invention, a chemical mechanical polishing (CMP) reworking process is carried out following the tungsten etchback process to remove any remaining tungsten including the barrier/adhesion layer 36. Optionally, the wafer process surface may be treated with potassium hydroxide at a pH of greater than about 10 to remove oxides of tungsten formed over the residual tungsten unetched areas prior to the CMP process. A tungsten CMP process is preferably used, for example including colloidal silica ($SiO_2$) and/or dispersed alumina ($Al_2O_3$) together with an oxidant such as ferric nitrate, potassium iodate, or hydrogen peroxide. An endpoint detection CMP process is preferably carried out as opposed to a time based CMP process to prevent over polishing the underlying IMD layer to avoid dishing or erosion around the tungsten plug. The CMP process typically exhibits no selectivity between tungsten and titanium nitride. For example, suitable endpoint detection means include real-time optical detection methods including wafer polishing surface reflectance measurements, as well as laser interferometry. In addition, methods such as polishing pad motor load monitoring, or monitoring the electrical potential of the polishing effluent may be suitably used for endpoint detection. It will be appreciated that a multi-step CMP process may be used including using more than one polishing platen and including an oxide buffing step following endpoint detection, for example, using a silica slurry to remove surface damage to the IMD layer.

Figure 2E:
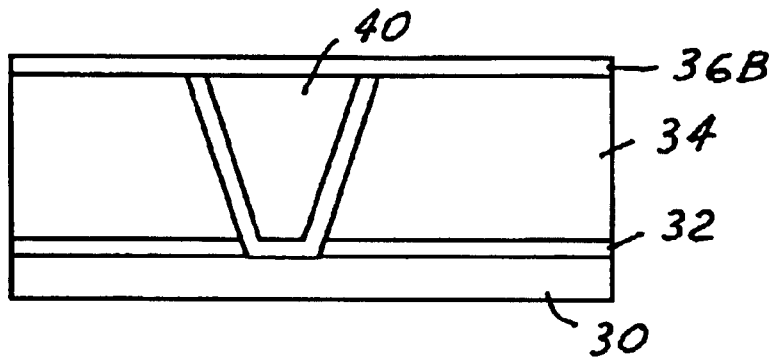

Referring to FIG. 2E, following the CMP reworking process, another barrier/adhesion layer 36B, preferably titanium nitride, is deposited to about the thickness of removed barrier/adhesion layer 36, for example about 300 to about 800 Angstroms, prior to carrying out subsequent manufacturing processes.

In one embodiment, following the CMP reworking process a metal layer, for example, an aluminum:copper (AlCu) alloy layer (not shown) is deposited over the barrier/adhesion layer 36B according to a conventional PVD method, for example ion metal plasma PVD. Following deposition of the AlCu layer, an overlying barrier/adhesion layer (not shown) also functioning as an ARC layer of, for example, titanium nitride is deposited. A photolithographic patterning process is then carried out to relocate alignment marks in an alignment mark area (not shown) typically located at the periphery, of the process wafer surface. This step is necessary since the CMP reworking process carried out to remove unetched tungsten areas and the barrier/adhesion layer 36B partially removes previous formed alignment marks. The alignment marks, as will be appreciated by a skilled practitioner are critical for forming aligned semiconductor features where automated steppers optically sense the alignment marks for proper wafer positioning in subsequent photolithographic patterning steps.

Figure 3:
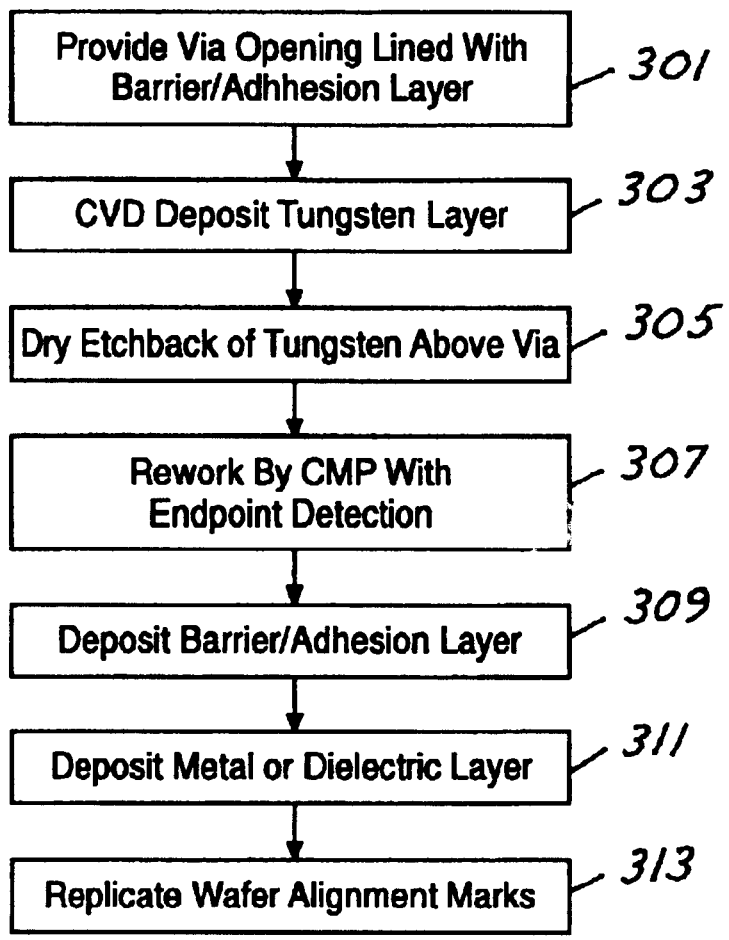
FIG. 3 is a process flow diagram including several embodiments of the present invention.

Referring to FIG. 3 is a process flow diagram including several embodiments of the present invention. In a first process 301 a dielectric insulating layer (IMD layer) is provided including anisotropically etched via openings lined with a blanket deposited barrier/adhesion layer (e.g., titanium nitride). In process 303, a tungsten layer is blanket deposited according to a CVD process to fill the via openings. In process 305, a dry etching etchback process is used to etch back the tungsten layer to reveal at least a portion of the barrier/adhesion layer. In process 307, a tungsten CMP reworking process is carried out to polish to endpoint detection of the dielectric insulating layer removing any remaining tungsten above the via level including the barrier/adhesion layer. In process 309, a second barrier/adhesion layer is deposited over the dielectric insulating layer to replace the removed first barrier/adhesion layer. In process 311, a metal or dielectric layer is deposited overlying the second barrier/adhesion layer. In process 313 wafer alignment marks are reformed or replicated by a photolithographic patterning and RIE process.

Thus according to the present invention, a method has been presented for reworking a semiconductor process wafer to remove overlying residual unetched tungsten areas caused by tungsten particle contamination following a dry etch back process. A CMP reworking process following the tungsten dry etch back process is employed to rework the tungsten particle contaminated wafer process surface while preserving a barrier/adhesion layer by re-deposition and preserving wafer alignment marks.

For example, in an exemplary implementation of the present invention it has been found that the tungsten particle contamination is completely removed by the additional CMP process according to the invention. Using the method of the present invention improved wafer acceptance testing (WAT) results and yield significantly, for example from about 5% to about 10% can be realized compared to other reworking procedures such as an additional dry etchback process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for reworking a tungsten particulate contaminated semiconductor wafer process surface following a tungsten dry etchback process comprising the steps of:

providing a semiconductor process wafer comprising including a dielectric insulating layer having anisotropically etched openings lined with a first barrier/adhesion layer formed according to a first blanket deposition process and an overlying tungsten layer formed according to a second blanket deposition process filling the anisotropically etched openings;

dry etching in an etchback process to remove the tungsten layer to form a process surface revealing at least a portion of the first barrier/adhesion layer and including tungsten layer particulate contaminants remaining on the process surface;

performing a chemical mechanical polishing (CMP) process on the process surface to remove a remaining portion of the tungsten layer particulate contaminants and the first barrier/adhesion layer; and, blanket depositing a second barrier/adhesion layer over the dielectric insulating layer according to a third blanket deposition process.

2. The method of claim 1, wherein the anisotropically etched openings comprise one of vias, contact holes, and trenches.

3. The method of claim 1, wherein at least the first, and third blanket deposition processes comprise a chemical vapor deposition (CVD) process.

4. The method of claim 1, wherein the first and second barrier/adhesion layers are selected from the group consisting of titanium, a titanium nitride, and silicided titanium nitride.

5. The method of claim 1, wherein the CMP process is carried out to endpoint detection of the dielectric insulating layer.

6. The method of claim 1, wherein the CMP process includes using a polish slurry comprising at least one of colloidal silica ($SiO_2$) or dispersed alumina ($Al_2O_3$) together with an oxidant.

7. The method of claim 1, wherein the process surface is treated with a hydroxide containing solution to remove tungsten oxides prior to the CMP process.

8. The method of claim 1, wherein the CMP process includes polishing the dielectric insulating layer with a silica abrasive following removal of the first barrier/adhesion layer.

9. The method of claim 1, further comprising the steps of:

depositing one of a metal layer and a second dielectric insulating layer over the second barrier/adhesion layer; and replicating wafer alignment marks according to a photolithographic patterning reactive ion etching process.

10. A method for reworking a wafer process surface to remove tungsten particulate contamination following a tungsten etchback process comprising the steps of:

providing a semiconductor process wafer comprising an uppermost tungsten layer blanket deposited over via openings;

dry etching in an etchback process to remove at least a portion of the tungsten layer above a via opening level to leave tungsten particulates over a process surface;

carrying out a particle detection process to count the tungsten particulates;

reworking the process surface according to a chemical mechanical polishing (CMP) process to remove the tungsten particulates including an underlying first barrier/adhesion layer to at least partially expose an underlying dielectric insulating layer; and, blanket depositing according to a CVD process a second barrier/adhesion layer over the dielectric insulating layer.

11. The method of claim 10, wherein the first and second barrier/adhesion layers are selected from the group consisting of titanium, titanium nitride, and silicided titanium nitride.

12. The method of claim 10, wherein the CMP process includes using a polish slurry including at least one of colloidal silica ($SiO_2$) or dispersed alumina ($Al_2O_3$) together with an oxidant selected from the group consisting of ferric nitrate, potassium iodate, and hydrogen peroxide.

13. The method of claim 10, wherein the wafer process surface is treated with a potassium hydroxide solution to remove tungsten oxide prior to the CMP process.

14. The method of claim 10, wherein the CMP process includes polishing the dielectric insulating layer with a silica abrasive following at least partially exposing the dielectric insulating layer.

15. The method of claim 10, further comprising the steps of:

depositing a metal layer over the second barrier/adhesion layer; and, replicating wafer alignment marks according to a photolithographic patterning and reactive ion etching process.

16. The method of claim 10, wherein the second barrier/adhesion layer is blanket deposited to at least about the same thickness as the first barrier/adhesion layer.

17. The method of claim 1, wherein the second barrier/adhesion layer is deposited to a thickness about equal to the first barrier/adhesion layer.

18. The method of claim 17, wherein the thickness of the first and second barrier/adhesion layers are between about 300 and about 800 Angstroms.

19. The method of claim 10, wherein the particle detection process comprises an optical scanning process.

20. The method of claim 15, wherein the metal layer comprises an AlCu alloy.

* * * * *